(12) United States Patent
Dias et al.

(10) Patent No.: US 10,224,290 B2
(45) Date of Patent: Mar. 5, 2019

(54) ELECTROMAGNETICALLY SHIELDED ELECTRONIC DEVICES AND RELATED SYSTEMS AND METHODS

(71) Applicant: Intel Corporation, Santa Clara, CA (US)

(72) Inventors: Rajendra Dias, Phoenix, AZ (US); Takashi Kumamoto, Tsukuba (JP); Yoshishiro Tomita, Tsukuba (JP); Mitul Modi, Phoenix, AZ (US); Joshua Heppner, Chandler, AZ (US); Eric Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/757,965

(22) Filed: Dec. 24, 2015

(65) Prior Publication Data
US 2017/0186697 A1    Jun. 29, 2017

(51) Int. Cl.
*H01L 21/56* (2006.01)
*H01L 23/552* (2006.01)
*H01L 23/31* (2006.01)
*H01L 25/16* (2006.01)

(52) U.S. Cl.
CPC .......... *H01L 23/552* (2013.01); *H01L 21/565* (2013.01); *H01L 23/3135* (2013.01); *H01L 21/561* (2013.01); *H01L 23/3121* (2013.01); *H01L 25/16* (2013.01); *H01L 2224/73204* (2013.01)

(58) Field of Classification Search
CPC ....... H01L 23/55; H01L 23/552; H01L 23/56; H01L 23/565; H01L 21/16; H01L 21/56; H01L 21/561; H01L 21/565; H01L 25/16

USPC .......................................................... 257/659
See application file for complete search history.

(56) References Cited

U.S. PATENT DOCUMENTS

| 8,587,096 B2 * | 11/2013 | Kim .................. H01L 21/561 |
| | | 257/659 |
| 2006/0113642 A1 | 6/2006 | Kajiki et al. |
| 2013/0113088 A1 * | 5/2013 | Zhao .................. H01L 21/56 |
| | | 257/659 |

(Continued)

FOREIGN PATENT DOCUMENTS

| WO | WO 2008/027888 A2 | 3/2008 |
| WO | WO 2010/069786 A1 | 6/2010 |

OTHER PUBLICATIONS

PCT Search Report and Written Opinion for application No. PCT/US16/63733, dated Apr. 25, 2017, 16 pages.

*Primary Examiner* — Monica D Harrison
(74) *Attorney, Agent, or Firm* — Thorpe North and Western, LLP; David W. Osborne

(57) ABSTRACT

Electromagnetically shielded electronic device technology is disclosed. In an example, a method of making an electronic device package can comprise providing a substrate having a conductor pad and an electronic component. The method can also comprise forming a conformal insulating layer on the substrate and electronic component. The conformal insulating layer conforms to the electronic component. The method can further comprise exposing the conductor pad. In addition, the method can comprise forming an electrically conductive electromagnetic interference (EMI) layer on the insulating layer and in contact with the conductor pad.

20 Claims, 5 Drawing Sheets

(56) References Cited

U.S. PATENT DOCUMENTS

2013/0292808 A1\* 11/2013 Yen ..................... H01L 23/552
                                                                                                      257/660

\* cited by examiner

ELECTROMAGNETICALLY SHIELDED ELECTRONIC DEVICES AND RELATED SYSTEMS AND METHODS

TECHNICAL FIELD

Embodiments described herein relate generally to electromagnetically shielded electronic devices.

BACKGROUND

Electromagnetic interference (EMI) shielding for an electronic device package (e.g., a system-in-a-package (SiP)) can be created using a physical vapor deposition (PVD) process such as sputtering. For example, an electrically conductive material can be deposited onto an exposed molded surface of the package (e.g., a mold compound such as an electronic grade epoxy) to create an EMI shield layer. For EMI shielding between components of the package, a trench can be made by a laser through the mold compound at a location between the components. The trench is then filled with a conductive material prior to depositing the EMI layer material on the surface of the mold compound.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
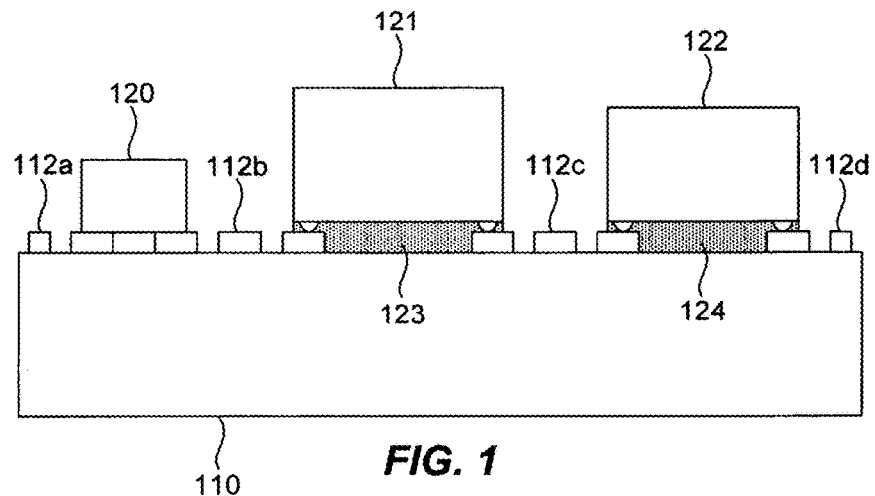
FIG. 1 illustrates an exemplary substrate having conductor pads and electronic components mounted thereon.

Reference will now be made to exemplary invention embodiments and specific language will be used herein to describe the same. It will nevertheless be understood that no limitation of the technology scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "an electronic component" includes a plurality of such electronic components.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term, like "comprising" or "including," in this specification, it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

EXAMPLE EMBODIMENTS

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Current processes for electromagnetically shielding electronic devices in an electronic device package have certain drawbacks. In particular, laser trenching through a thick layer of epoxy mold compound in order to expose electrical pads is a time consuming process. In addition, a minimum aspect ratio of 1.0 for the mold compound thickness and the spacing between components is required for laser trenching. The thickness of the mold compound therefore puts limitations on the minimum spacing between components.

Certain invention embodiments provide methods of making an electronic device package with reduces or minimized time as compared to currently used processes, thereby reducing cost. Another advantage is the ability to reduce or minimize spacing between components, thus reducing package size. Such methods can include: providing a substrate having a conductor pad and an electronic component; encapsulating the electronic component on the substrate with an insulating layer; exposing the conductor pad; and forming an electrically conductive EMI layer on the insulating layer and in contact with the conductor pad. Such methods can further include coating the EMI layer with an encapsulation layer or outer encapsulation layer. Such methods can apply to any technology that utilizes EMI shielding of components, including EMI shielding between components or for groups of components.

Referring to FIGS. 1-5, an exemplary method of making an electromagnetically shielded electronic device package is illustrated. In particular, the electronic device package in this example will include EMI shielding about one or more electronic components, such as those found in a SiP, where a variety of closely spaced components are to be individually shielded from one another. The method can include providing or obtaining a substrate 110 having one or more conductor pads 112a-d (e.g., grounding pads) and one or more electronic components 120-122 mounted on the substrate 110, as illustrated in FIG. 1. The electronic components 120-122 can comprise dies, processors, chips, packaged components and other devices, including as passives, etc. The electronic components 120-122 can be mounted on the substrate 110 in any suitable manner. Some electronic components, as represented by the electronic components 121, 122, can have underfill 123, 124 applied to flip chip bonded dies.

Figure 2:
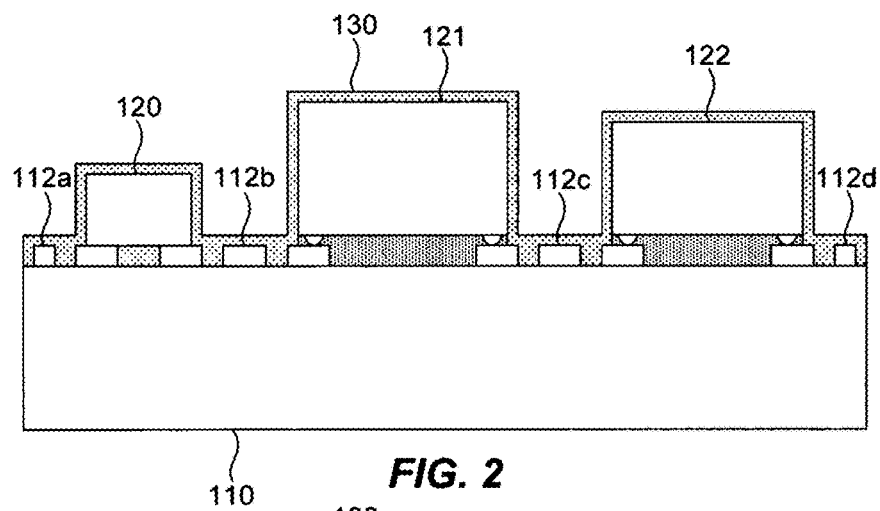
FIG. 2 illustrates an example of an insulating layer, such as a conformal insulating layer encapsulating conductor pads and electronic components on a substrate.

The method can also include forming an insulating layer, such as a conformal insulating layer 130 on the substrate 110 and electronic components 120-122, as illustrated in FIG. 2. The conformal insulating layer 130 can be formed about the electronic components 120-122 such that the insulating layer 130 conforms to the electronic components 120-122. The conformal insulating layer 130 can be formed of any suitable material (e.g., a dielectric material). In some embodiments, the conformal insulating layer 130 can be a thin layer from about 10 nm to about 100 μm thick, which may vary depending on the technique or process utilized to form the layer 130. For example, the conformal insulating layer 130 can be very thin, for example about 10 nm thick when using a spray process to form the layer 130, or about 50 μm when using a dispense or print approach to form the layer 130. The thickness of the conformal insulating layer 130 can therefore depend on filler size or type and the technique utilized to form the layer 130 (e.g., deposition by spraying, printing, dispensing, and/or lamination). In addition, the thickness of the conformal insulating layer 130 can depend on the gap or spacing (e.g., the lateral distance) in between the electronic components 120-122. In other words, the conformal insulating layer 130 should fit between adjacent electronic components that are to be shielded from one another. Thus, the thickness of the conformal insulating layer 130 will be thinner than the gap or spacing between such electronic components. In general, a thinner layer 130 may be more desirable to ensure that each of the electronic components 120-122 can be compartmentally shielded. On the other hand, the conformal insulating layer 130 should be formed to cover the electronic components 120-122 without pinholes in order to avoid a bridge between the electronic components 120-122 and the conformal insulating layer 130. As the thickness of the insulating layer 130 decreases, the process time required to manufacture the electronic device package also decreases. Reducing the thickness of the insulating layer 130 can also provide for reduced spacing between the electronic components 120, 121 and between the electronic components 121, 122, which can reduce the size of the electronic device package containing such components.

The conformal insulating layer 130 can conform individually to one or more of the electronic components 120-122. Although the conformal insulating layers in the figures are illustrated as having linear and/or planar outer surfaces, it should be recognized that outer surfaces of conformal insulating layers can have any suitable configuration, such as curved and/or angled surfaces, to conform to one or more electronic components. Exposed surfaces of the electronic devices 120-122 and the substrate 110 can be conformally coated with an insulating (e.g., a dielectric) material by any suitable technique, such using a deposition process (e.g., atomization or sputtering), a spraying process, a printing process, a lamination process, a molding process, etc. Such processes of forming the conformal insulating layer 130 can result in the conductor pads 112a-d being covered by the conformal insulating layer 130.

Figure 3:
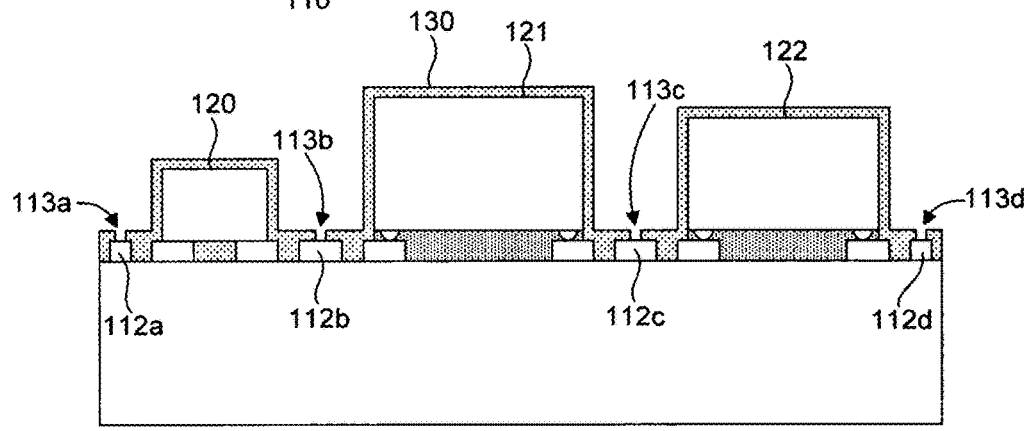
FIG. 3 illustrates an example of an insulating layer insulating layer encapsulating conductor pads and electronic components on a substrate with openings formed to expose the conductor pads.

Thus, the method can further include exposing the conductor pads 112a-d, as illustrated in FIG. 3, to facilitate electrically coupling EMI shielding to the conductor pads 112a-d. The conductor pads 112a-d can be exposed by forming openings 113a-d through the conformal insulating layer 130 to the conductor pads 112a-d, respectively. The openings 113a-d can be of any suitable configuration (e.g., a trench, a slot, a via, a hole, etc.) to facilitate electrically coupling EMI shielding with the conductor pads 112a-d. Such openings 113a-d can be formed through the thin conformal insulating layer 130 to the conductor pads 112a-d by any suitable technique, such as excimer laser ablation, laser assisted chemical etching, ion milling through a mask, etc. By reducing or minimizing the thickness of the insulating layer 130, the amount of material removed to form the openings 113a-d can also be reduced or minimized, thereby reducing or minimizing the process time required to manufacture the electronic device package. In other words, conformal coating of the thin insulating layer 130 of material can facilitate the use of excimer laser ablation or other suitable techinique for exposing the conductor pads 112a-d through the thin insulating layer 130, which can reduce the process time for exposure of the conductor pads 112a-d when compared to a typical process of UV/IR laser ablation through thick mold material over a ground pad. In one aspect, use of a reduced projection excimer laser can facilitate the formation of small openings, such as about 10 μm wide trenches. Excimer laser ablation patterning of thin insulating layer 130 can make a trench width or a via hole diameter smaller than with deep trench laser drilling through thick epoxy mold compound, typically utilized to create shielding partitions between on-board components. This can facilitate a reduction in spacing between the electrical components 120-122 and in the size of the conductor pads 112a-d, which can lead to a size reduction of a SiP package foot print. The thin conformal layer 130 can also provide for a reduction in package thickness. In addition, excimer laser ablation using a photomask can be employed to simultaneously form multiple openings. For example, multiple trenches and/or vias for closely spaced electrical components can be made at the same time using a photomask assisted excimer laser ablation process. Utilizing photomask assisted excimer laser ablation can provide for very fast fabrication of multiple openings (e.g., trenches and/or vias) simultaneously when compared to the typical UV/IR laser ablation for one electrical component at a time. Utilizing laser assisted chemical etching or ion milling through a mask to expose the conductor pads 112a-d may provide similar benefits and advantages.

Figure 4:
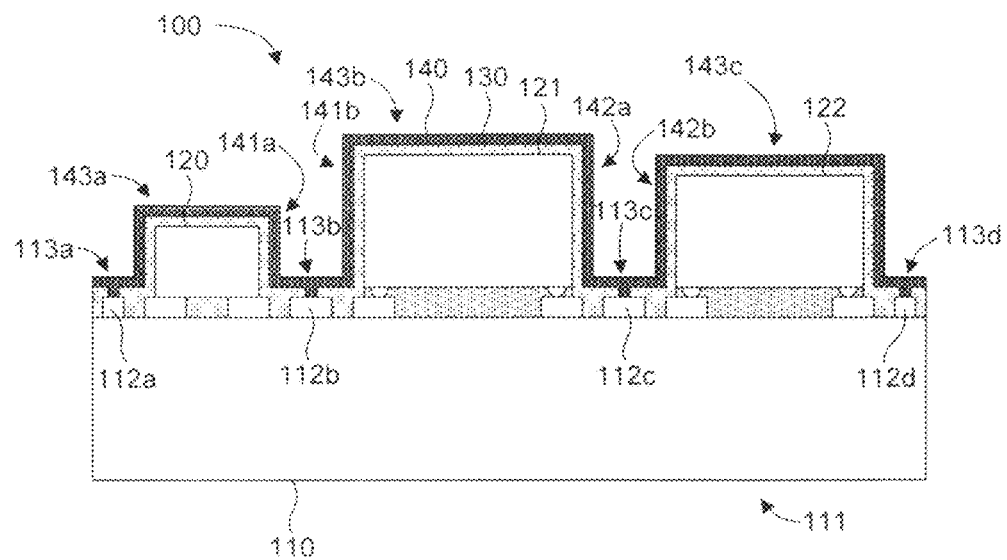
FIG. 4 illustrates an example of an electrically conductive or EMI layer formed on an insulating layer encapsulating electronic components on a substrate.

With the conductor pads 112a-d exposed, an electrically conductive or electromagnetic interference (EMI) layer 140 can be formed on the insulating layer 130, as illustrated in FIG. 4, for an electromagnetic shield associated with the substrate 110. The electrically conductive layer 140 can be in contact with, or make a connection to, the conductor pads 112a-d by extending through the openings 113a-d. The electrically conductive material and the layer 140 thickness can be of any suitable type and thickness to form a conformal shielding overcoat. In one aspect, the electrically conductive material and thickness can be defined by electrical conductivity, magnetic permeability, and/or EMI shielding requirements. The electrically conductive layer 140 can be formed by any suitable technique, such as a deposition process (e.g., atomization or sputtering), a plating process, a spraying process, a printing process, a lamination process, a molding process, etc. Conformal coating of electrically conductive layer 140 material can also provide for a reduction in thickness of the electronic device package.

In one aspect, due to the insulating layer 130 conforming about the electrical components 120-122, the electrically conductive layer 140 can be formed about the electronic components 120-122 individually. The conformal insulating layer 130 can also facilitate a plurality of electrically conductive layer portions 141a-b, 142a-b to be disposed between electrical components, in contrast to a single electrical conductor-filled trench between components resulting from the typical UV/IR laser ablation process. For example, the electrically conductive layer portions 141a-b can be disposed between the electrical components 120, 121, and the electrically conductive layer portions 142a-b can be disposed between the electrical components 121, 122. The electrically conductive layer 140 can be connected to the conductor pad 112b between the electrical components 120, 121, and to the conductor pad 112c between the electrical components 121, 122. In addition, by forming the electrically conductive layer 140 about the electrical components 120-122 at the same time (e.g., by a deposition process), the side portions 141a-b, 142a-b of the electrically conductive layer 140 can be integrally formed with top portions of the electrically conductive layer 140, in contrast to the separately formed electrical conductor-filled trench and electrical conductor deposited on a mold compound surface as a result of the typical process. For example, the side portion 141a can be integrally formed with a top portion 143a, the side portions 141b, 142a can be integrally formed with a top portion 143b, and the side portion 142b can be integrally formed with a top portion 143c. Although the side portions (e.g., side portions 141a-b, 142a-b) of the electrically conductive layer 140 are illustrated as being oriented perpendicular to the top surface of the substrate 110, one or more side portions of the electrically conductive layer 140 can be oriented at a non-perpendicular angle relative to the top surface of the substrate. In some aspects, the electrically conductive layer can be a continuous layer of a single material extending across the entire electronic device package, and can be formed as such.

With the electrically conductive layer 140 in place, an electronic device package 100 can be singulated or physically separated from other packages into individual packages. The electronic device package 100 can also be prepared for electrically coupling with another component (e.g., a motherboard), such as by attaching solder balls (not shown) on a back side 111 of the electronic device package.

Figure 5:
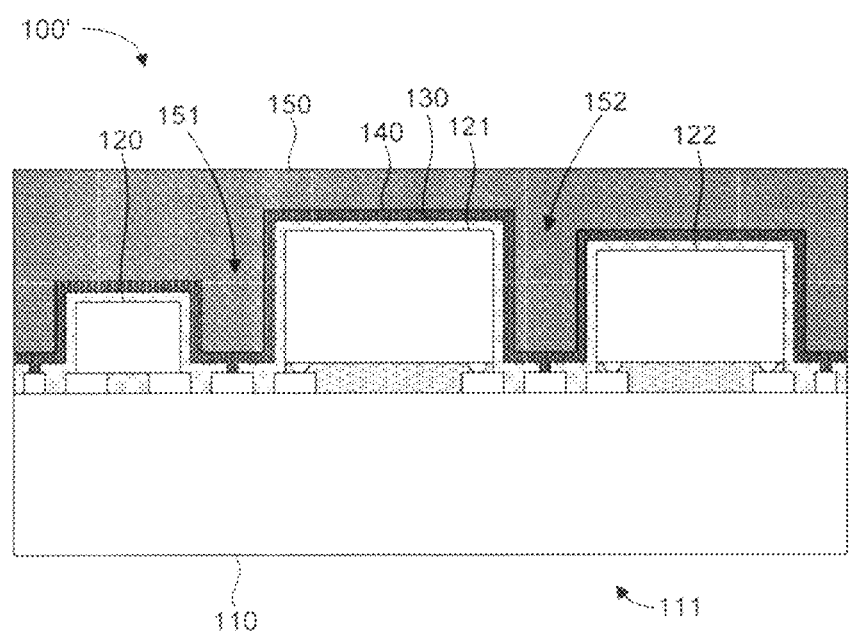
FIG. 5 illustrates an example of a device package with an encapsulation layer over an electrically conductive or EMI layer formed on an insulating layer encapsulating electronic components on a substrate.

In one aspect, the method can optionally include forming an encapsulation layer 150 (i.e. an outer layer, top layer, or protective layer) on the electrically conductive layer 140, as illustrated in FIG. 5, to protect the electrically conductive layer 140 and other components of an electronic device package. The encapsulation layer 150 can be formed by any suitable technique (e.g., transfer or compression molding) using any suitable encapsulation material, such as a molding compound (e.g., an electronic grade epoxy). In one aspect, due to the conformal insulating and electrically conductive layers 130, 140 about the electrical components 120-122, the portions of the encapsulation layer 150 can be disposed between electrical components. For example, an encapsulation layer portion 151 can be disposed between the electrical components 120, 121, and an encapsulation layer portion 152 can be disposed between the electrical components 121, 122.

With the encapsulation layer 150 in place, an electronic device package 100' can be singulated or physically separated from other packages into individual packages. The electronic device package 100' can also be prepared for electrically coupling with another component (e.g., a motherboard), such as by attaching solder balls (not shown) on a back side 111 of the electronic device package.

Figure 6:
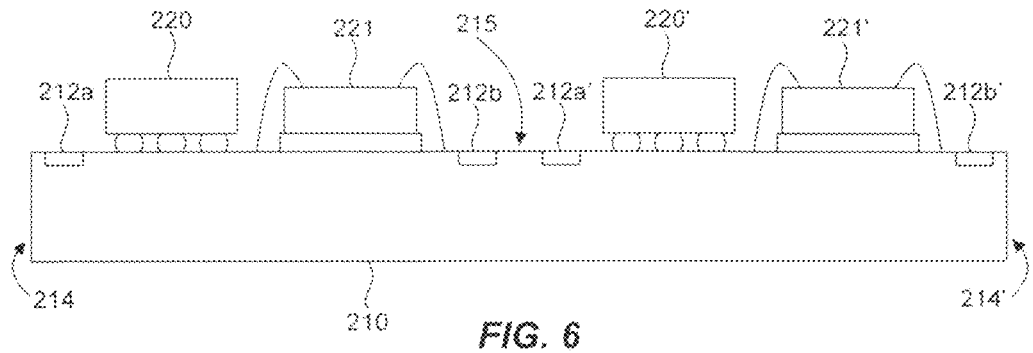
FIG. 6 illustrates another example of a substrate having conductor pads and electronic components mounted thereon.

FIGS. 6-10 illustrate a method of making an electromagnetically shielded electronic device package in accordance with another example of the present disclosure. In particular, the package in this example will include EMI shielding about one or more electronic components at the unit or strip level (e.g., containing multiple units). The method can include providing or obtaining a substrate 210 having one or more conductor pads 212a-b, 212a'-b' and one or more electronic components 220, 221, 220', 221' mounted on the substrate 210, as illustrated in FIG. 6. The electronic components 220, 221 form a first group of electronic components and the electronic components 220', 221' can form a second group of electronic components associated with respective first and second portions 214, 214' of the substrate 210. The conductor pads 212a-b, 212a'-b' are exposed at a surface 215 of the substrate 210.

Figure 7:
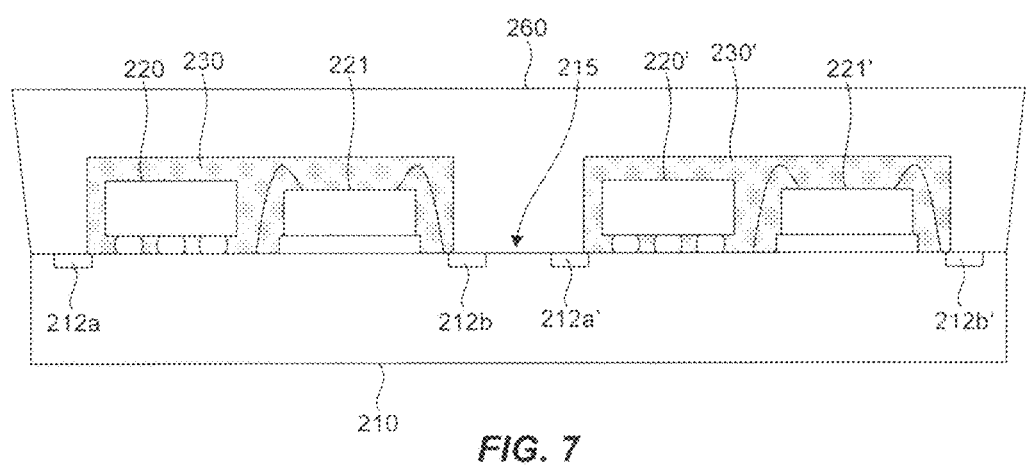
FIG. 7 illustrates an example of an insulating layer, such as a conformal insulating layer encapsulating electronic device components and conductor pads on a substrate.

The method can also include forming insulating layers, such as conformal insulating layers 230, 230' on the substrate 210 and electronic components 220, 221, 220', 221', as illustrated in FIG. 7. The conformal insulating layer 230 can be formed about the electronic components 220, 221, 220', 221' such that the insulating layer 230 conforms to the first group of electronic components 220, 221, and the insulating layer 230' conforms to the second group of electronic components 220', 221'. The conformal insulating layers 230, 230' can be formed by any suitable technique, such as a deposition process (e.g., atomization or sputtering), a spraying process, a printing process, a lamination process, a molding process, etc. FIG. 7 illustrates forming the conformal insulating layers 230, 230' by molding an insulating material. In this example, a mold chase 260 can be used in a molding process, such as a transfer or compression molding process to apply the conformal insulating layers 230, 230' about the electronic components 220, 221, 220', 221'.

The method can further include exposing the conductor pads 212a-b, 212a'-b' to facilitate electrically coupling EMI shielding to the conductor pads 212a-b, 212a'-b'. The conductor pads 212a-b, 212a'-b' can be exposed by masking the conductor pads such that the conformal insulating layers 230, 230' are prevented from contacting at least a portion of the conductor pads 212a-b, 212a'-b'. As illustrated in FIG. 7, the conductor pads 212a-b, 212a'-b' can be masked by covering the conductor pads 212a-b, 212a'-b' with the mold chase 260. Thus, a mold process can be utilized to apply an insulating material around the electronic components 220, 221, 220', 221' but not completely covering the conductor pads 212a-b, 212a'-b' at the surface 215 of the substrate 210. The amount and degree to which the conductor pad is covered can be adjusted by utilizing an appropriate mold chase. In one example, the conductor pad can be free of, such as completely free of insulator material following application of the insulating material around the electronic components. In another example, the conductor pad can be partially covered. In a further example the conductor pad can have at least 10% of its surface exposed. In another example, the conductor pad can have 15% to 95% of its surface exposed. With at least some portion of each of the conductor pads 212a-b, 212a'-b' remaining exposed, there is no need to remove insulating layer 230 material to provide access for an EMI shielding connection. Thus, the process time required to manufacture the electronic device package can be reduced due to the absence of a material removal process to expose the conductor pads.

In one aspect, a mold process can be employed where the conductor pads 212a-b, 212a'-b' are completely covered by insulating material (i.e., a thin layer) at the surface of the substrate 210. In this case, the conductor pads 212a-b, 212a'-b' can be exposed as in the example discussed above with regard to FIGS. 1-5 (e.g., laser ablation).

Figure 8:
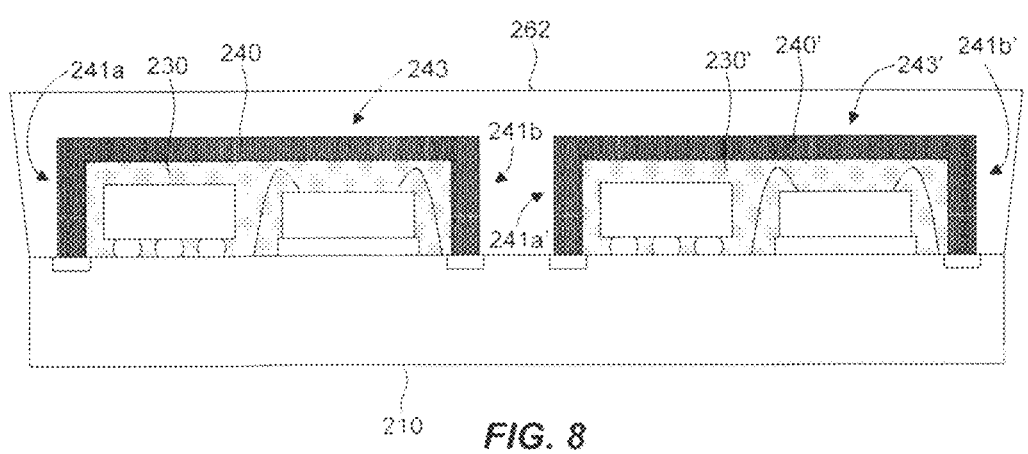
FIG. 8 illustrates an example of an electrically conductive EMI layer formed on an insulating layer encapsulating electronic components on a substrate.

With the conductor pads 212a-b, 212a'-b' exposed, the method can include forming electrically conductive or electromagnetic interference (EMI) layers 240, 240' on the insulating layers 230, 230', respectively, as illustrated in FIG. 8, for electromagnetic shields associated with the substrate 210. The electrically conductive layers 240, 240' can be in contact with, or make a connection to, the conductor pads 212a-b, 212a'-b'. For example, the electrically conductive layer 240 can be in contact with the conductor pads 212a-b, and the electrically conductive layer 240' can be in contact with the conductor pads 212a'-b'. The electrically conductive layers 240, 240' can be formed by any suitable technique, such using a deposition process (e.g., atomization or sputtering), a plating process, a spraying process, a printing process, a lamination process, a molding process, etc. FIG. 8 illustrates forming the electrically conductive layers 240, 240' by molding an electrically conductive material. In this example, a mold chase 262 can be used in a transfer or compression molding process to form the electrically conductive layers 240, 240' on the insulating layers 230, 230' about the electronic components 220, 221, 220', 221'. Conformal coating of the electrically conductive material layer 240, 240' can provide for a reduction in thickness of an electronic device package.

In addition, by forming the electrically conductive layers 240, 240' on the insulating layers 230, 230' and about the electronic components 220, 221, 220', 221' at the same time (e.g., by a molding process), the side portions 241a-b, 241a'-b' of the electrically conductive layers 240, 240' can be integrally formed with top portions of the electrically conductive layers 240, 240', respectively. For example, the side portions 241a-b can be integrally formed with a top portion 243, and the side portions 241a'-b' can be integrally formed with a top portion 243'. Although the side portions side portions 241a-b, 241a'-b' of the electrically conductive layers 240, 240' are illustrated as being oriented perpendicular to the top surface of the substrate 210, one or more of the side portions 241a-b, 241a'-b' can be oriented at a non-perpendicular angle relative to the top surface of the substrate.

Figure 9:
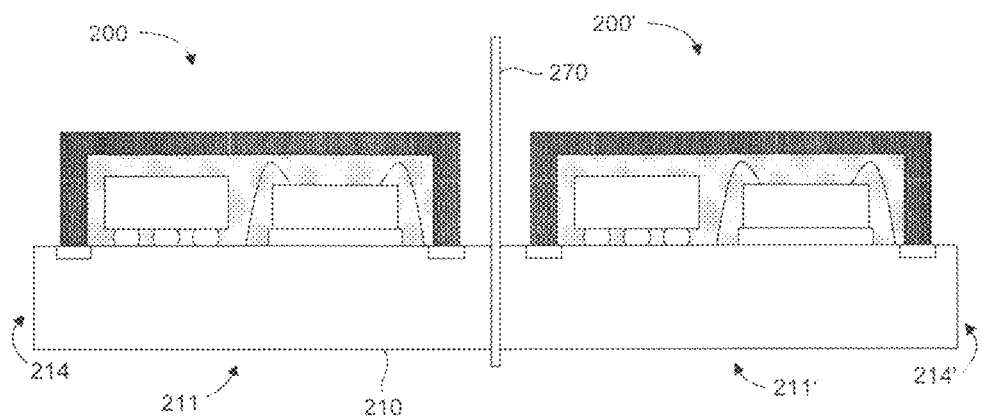
FIG. 9 illustrates an example of singulating or separating individual electronic device packages from one another.

With the electrically conductive layer 240 in place, electronic device packages 200, 200' can be singulated or separated from one another into individual packages, as illustrated in FIG. 9. For example, the first and second portions 214, 214' of the substrate 210 can be separated to form the electronic device packages 200, 200'. The substrate 210 can be separated in any suitable manner, such as sawing with a saw blade 270. The electronic device packages 200, 200' can also be prepared for electrically coupling with another component (e.g., a motherboard), such as by attaching solder balls (not shown) on back sides 211, 211' of the packages.

Figure 10:
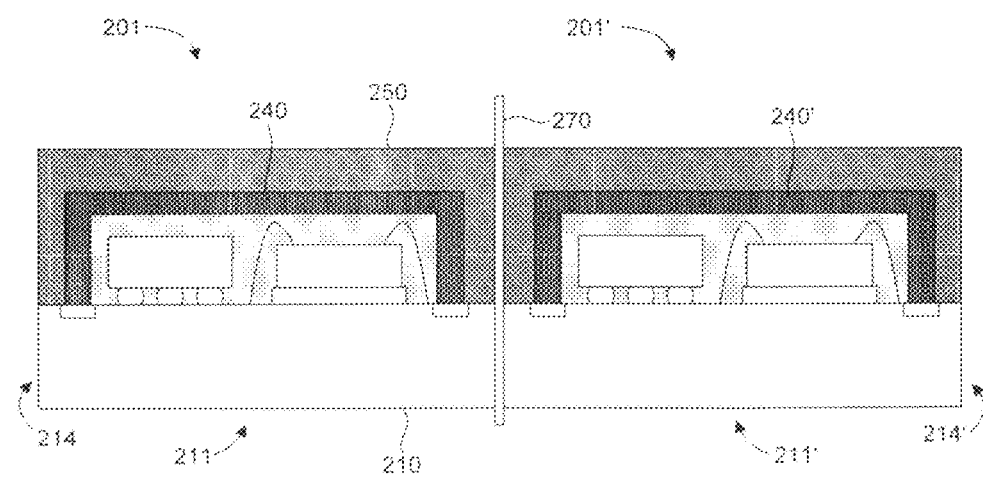
FIG. 10 illustrates an example of singulating or separating individual electronic device packages with an encapsulation layer on an electrically conductive layer from one another.

In one aspect, the method can optionally include forming an encapsulation (i.e. a top, outer, or protective) layer 250 on the electrically conductive layers 240, 240', as illustrated in FIG. 10, to protect the electrically conductive layers 240, 240' and other components of electronic device packages 201, 201'. The encapsulation layer 250 can be formed by any suitable technique (e.g., transfer or compression molding) using any suitable encapsulation material, such as a molding compound (e.g., an electronic grade epoxy). In this example, a portion of the encapsulation layer 250 is in contact with the substrate 210 (e.g., the top surface of the substrate).

With the encapsulation layer 250 in place, the electronic device packages 201, 201' can be singulated or separated from one another into individual packages, as illustrated in FIG. 10. For example, the first and second portions 214, 214' of the substrate 210 and the encapsulation layer 250 can be separated to form the electronic device packages 201, 201'. The substrate 210 and the encapsulation layer 250 can be separated in any suitable manner, such as sawing with the saw blade 270. The electronic device packages 201, 201' can be prepared for electrically coupling with another component (e.g., a motherboard), such as by attaching solder balls (not shown) on back sides 211, 211' of the packages.

Thus, in one embodiment an electronic device package with a single die or multiple dies can made at the strip level, where the formation of the conformal insulating layer, the electrically conductive layer, and the (optional) encapsulation layer can be made using sequential molding processes as an alternative to making such packages using a laser ablation process, which may be used to expose conductor pads.

Figure 11:
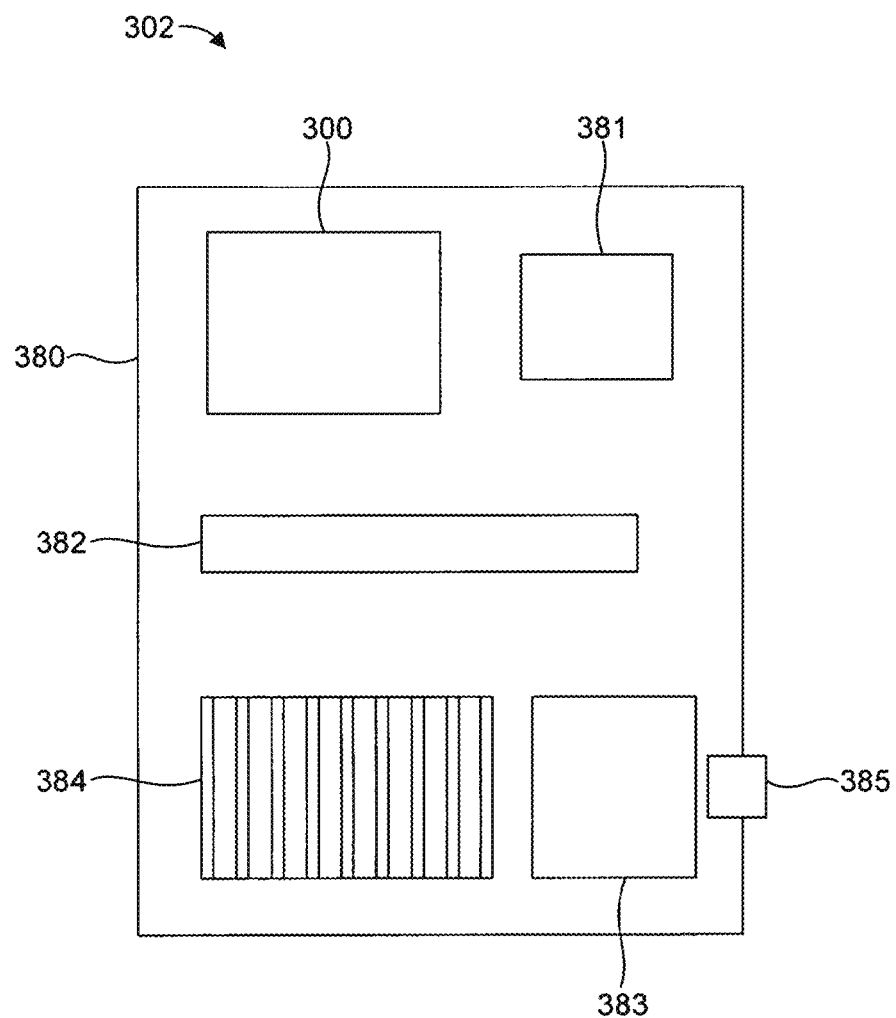
FIG. 11 is a schematic illustration of an exemplary computing system.

In one aspect, illustrated in FIG. 11, an electronic device package 300 as disclosed herein can form part of a computing system 302. The computing system 302 can include a motherboard 380, as well as a processor 381, a memory device 382, a radio 383, a heat sink 384, a port 385, a slot, or any other suitable device, which can be operably coupled to the motherboard 380. The computing system 302 can comprise any type of computing system, such as a desktop computer, a laptop computer, a tablet computer, a smartphone, a server, etc.

EXAMPLES

The following examples pertain to further embodiments.

In one example a method of making an electronic device package is provided, comprising: providing a substrate having a conductor pad and an electronic component; forming a conformal insulating layer on the substrate and electronic component, wherein the conformal insulating layer conforms to the electronic component; exposing the conductor pad, or at least a portion of the conductor pad; and forming an electrically conductive electromagnetic interference (EMI) layer on the insulating layer and in contact with the conductor pad.

In one example of a method of making an electronic device package, exposing the conductor pad comprises forming an opening through the conformal insulating layer to the conductor pad, wherein the electrically conductive layer extends into the opening in contact with the conductor pad.

In one example of a method of making an electronic device package, forming an opening through the conformal insulating layer comprises ablating the conformal insulating layer with a laser.

In one example of a method of making an electronic device package, exposing the conductor pad comprises masking the conductor pad such that the conformal insulating layer is prevented from contacting at least a portion of the conductor pad.

In one example of a method of making an electronic device package, masking the conductor pad comprises covering the conductor pad with a mold chase, wherein forming the conformal insulating layer comprises molding an insulating material.

In one example of a method of making an electronic device package, the electronic component comprises a first electronic component and a second electronic component.

In one example of a method of making an electronic device package, the conformal insulating layer conforms individually to at least one of the first electronic component and the second electronic component.

In one example of a method of making an electronic device package, the first electronic component and the second electronic component form a group of electronic components, and the conformal insulating layer conforms to the group of electronic components.

In one example of a method of making an electronic device package, a plurality of conductive layer portions is disposed between the first and second electronic components.

In one example of a method of making an electronic device package, the electrically conductive layer is formed about the first and second electronic components individually.

In one example of a method of making an electronic device package, forming a conformal insulating layer comprises depositing an insulating material.

In one example of a method of making an electronic device package, depositing the insulating material comprises atomizing the insulating material.

In one example of a method of making an electronic device package, forming a conformal insulating layer comprises molding an insulating material.

In one example of a method of making an electronic device package, forming the electrically conductive layer comprises depositing an electrically conductive material.

In one example of a method of making an electronic device package, depositing the electrically conductive material comprises at least one of atomizing, printing, sputtering, and plating the electrically conductive material.

In one example of a method of making an electronic device package, forming the electrically conductive layer comprises molding an electrically conductive material.

In one example of a method of making an electronic device package, the method further comprises forming an encapsulation layer on the electrically conductive layer.

In one example of a method of making an electronic device package, the electronic component comprises a first electronic component and a second electronic component, wherein at least a portion of the encapsulation layer is disposed between the first electronic component and the second electronic component.

In one example of a method of making an electronic device package, portion of the encapsulation layer is in contact with the substrate.

In one example of a method of making an electronic device package, forming an encapsulation layer comprises molding an encapsulation material.

In one example of a method of making an electronic device package, the encapsulation material comprises an epoxy.

In one example of a method of making an electronic device package, the electronic component comprises a first electronic component and a second electronic component associated with respective first and second portions of the substrate, the method further comprising separating the first and second portions of the substrate to form first and second electronic device packages.

In one example of a method of making an electronic device package, separating the first and second portions of the substrate comprises cutting the substrate.

In one example of a method of making an electronic device package, a side portion of the electrically conductive layer is integrally formed with a top portion of the electrically conductive layer.

In one example of a method of making an electronic device package, a side portion of the electrically conductive layer is oriented at a non-perpendicular angle relative to a top surface of the substrate.

In one example, there is provided a method of electromagnetically shielding an electronic device package comprising: forming a conformal insulating layer about an electronic component mounted on a substrate, wherein the conformal insulating layer conforms to the electronic component; and forming an electrically conductive layer on the insulating layer and in contact with a conductor pad on the substrate for an electromagnetic shield associated with the substrate.

In one example of a method of electromagnetically shielding an electronic device package, the conductor pad is covered by the conformal insulating layer, the method further comprising forming an opening through the conformal insulating layer to the conductor pad, wherein the electrically conductive layer extends into the opening in contact with the conductor pad.

In one example of a method of electromagnetically shielding an electronic device package, forming the opening through the conformal insulating layer comprises ablating the conformal insulating layer with a laser.

In one example of a method of electromagnetically shielding an electronic device package, the method further comprises masking the conductor pad such that the conformal insulating layer is prevented from contacting at least a portion of the conductor pad.

In one example of a method of electromagnetically shielding an electronic device package, masking the conductor pad comprises covering the conductor pad with a mold chase, wherein forming the conformal insulating layer comprises molding an insulating material.

In one example of a method of electromagnetically shielding an electronic device package, the electronic component comprises a first electronic component and a second electronic component.

In one example of a method of electromagnetically shielding an electronic device package, the conformal insulating layer conforms individually to at least one of the first electronic component and the second electronic component.

In one example of a method of electromagnetically shielding an electronic device package, the first electronic component and the second electronic component form a group of electronic components, and the conformal insulating layer conforms to the group of electronic components.

In one example of a method of electromagnetically shielding an electronic device package, a plurality of conductive layer portions is disposed between the first and second electronic components.

In one example of a method of electromagnetically shielding an electronic device package, the electrically conductive layer is formed about the first and second electronic components individually.

In one example of a method of electromagnetically shielding an electronic device package, forming the conformal insulating layer comprises depositing an insulating material.

In one example of a method of electromagnetically shielding an electronic device package, depositing the insulating material comprises atomizing the insulating material.

In one example of a method of electromagnetically shielding an electronic device package, forming the conformal insulating layer comprises molding an insulating material.

In one example of a method of electromagnetically shielding an electronic device package, forming the electrically conductive layer comprises depositing an electrically conductive material.

In one example of a method of electromagnetically shielding an electronic device package, depositing the electrically conductive material comprises at least one of atomizing, printing, sputtering, and plating the electrically conductive material.

In one example of a method of electromagnetically shielding an electronic device package, forming the electrically conductive layer comprises molding an electrically conductive material.

In one example of a method of electromagnetically shielding an electronic device package, the method further comprises forming an encapsulation layer on the electrically conductive layer.

In one example of a method of electromagnetically shielding an electronic device package, the electronic component comprises a first electronic component and a second electronic component, wherein at least a portion of the encapsulation layer is disposed between the first electronic component and the second electronic component.

In one example of a method of electromagnetically shielding an electronic device package, a portion of the encapsulation layer is in contact with the substrate.

In one example of a method of electromagnetically shielding an electronic device package, forming the encapsulation layer comprises molding an encapsulation material.

In one example of a method of electromagnetically shielding an electronic device package, the encapsulation material comprises an epoxy.

In one example of a method of electromagnetically shielding an electronic device package, the electronic component comprises a first electronic component and a second electronic component associated with respective first and second portions of the substrate, method further comprising separating the first and second portions of the substrate to form first and second electronic device packages.

In one example of a method of electromagnetically shielding an electronic device package, separating the first and second portions of the substrate comprises cutting the substrate.

In one example of a method of electromagnetically shielding an electronic device package, a side portion of the electrically conductive layer is integrally formed with a top portion of the electrically conductive layer.

In one example of a method of electromagnetically shielding an electronic device package, a side portion of the electrically conductive layer is oriented at a non-perpendicular angle relative to a top surface of the substrate.

In one example there is provided, an electronic device package comprising: a substrate having a conductor pad; an electronic component coupled to the substrate; a conformal insulating layer on the electronic component and the substrate, wherein the conformal insulating layer conforms to the electronic component; and an electrically conductive electromagnetic interference (EMI) layer on the insulating layer and in contact with the conductor pad.

In one example of an electronic device package, the electronic component comprises a first electronic component and a second electronic component.

In one example of an electronic device package, the conformal insulating layer conforms individually to at least one of the first electronic component or the second electronic component.

In one example of an electronic device package, the first electronic component and the second electronic component form a group of electronic components and the conformal insulating layer conforms to the group of electronic components.

In one example of an electronic device package, a plurality of conductive layer portions is disposed between the first and second electronic components.

In one example of an electronic device package, the electrically conductive layer is formed about the first and second electronic components individually.

In one example of an electronic device package, the electronic device package further comprises an encapsulation layer on the electrically conductive layer.

In one example of an electronic device package, the electronic component comprises a first electronic component and a second electronic component, wherein at least a portion of the encapsulation layer is disposed between the first electronic component and the second electronic component.

In one example of an electronic device package, a portion of the encapsulation layer is in contact with the substrate.

In one example of an electronic device package, the encapsulation layer comprises an epoxy.

In one example of an electronic device package, a side portion of the electrically conductive layer is integrally formed with a top portion of the electrically conductive layer.

In one example of an electronic device package, a side portion of the electrically conductive layer is oriented at a non-perpendicular angle relative to a top surface of the substrate.

In one example there is provided, a computing system comprising a motherboard and an electronic device package as recited herein coupled thereto.

In one example of a computing system, the computing system comprises a desktop computer, a laptop computer, a tablet computer, a smartphone, a server, or a combination thereof.

In one example of a computing system, the computing system further comprises a processor, a memory device, a heat sink, a radio, a slot, a port, or a combination thereof operably coupled to the motherboard.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended thereby.

What is claimed is:

1. A method of making an electronic device package, comprising:
   providing a substrate having a first electronic component, a second electronic component, and a conductor pad between the first and second electronic components;
   forming a conformal insulating layer on the substrate, wherein the conformal insulating layer has a thickness that conforms to the first and second electronic components and defines vertical surfaces between the first and second electronic components and a horizontal surface over the conductor pad;
   exposing the conductor pad by forming an opening through the conformal insulating layer extending from the horizontal surface to the conductor pad; and
   forming an electrically conductive electromagnetic interference (EMI) layer on the conformal insulating layer and in contact with the conductor pad through the opening.

2. The method of claim 1, wherein forming a conformal insulating layer comprises depositing an insulating material.

3. The method of claim 1, wherein forming a conformal insulating layer comprises molding an insulating material.

4. The method of claim 1, wherein forming the electrically conductive layer comprises depositing an electrically conductive material.

5. The method of claim 1, wherein forming the electrically conductive layer comprises molding an electrically conductive material.

6. The method of claim 1, further comprising forming an encapsulation layer on the electrically conductive layer.

7. The method of claim 1, wherein the electronic component comprises a first electronic component and a second electronic component associated with respective first and second portions of the substrate, and further comprising separating the first and second portions of the substrate to form first and second electronic device packages.

8. The method of claim 1, wherein a side portion of the electrically conductive layer is integrally formed with a top portion of the electrically conductive layer.

9. The method of claim 1, wherein a side portion of the electrically conductive layer is oriented at a non-perpendicular angle relative to a top surface of the substrate.

10. An electronic device package, comprising:
    a substrate having a conductor pad;
    a first electronic component and a second electronic component coupled to the substrate such that the conductor pad is between the first and second electronic components;
    a conformal insulating layer on the first and second electronic components and the substrate, wherein the conformal insulating layer has a thickness that conforms to the first and second electronic components and defines vertical surfaces between the first and second electronic components and a horizontal surface over the conductor pad; and
    an electrically conductive electromagnetic interference (EMI) layer on the conformal insulating layer and in contact with the conductor pad, wherein the electrically conductive EMI layer extends from the horizontal surface of the conformal insulating layer to the conductor pad.

11. The electronic device package of claim 10, wherein the conformal insulating layer conforms individually to at least one of the first electronic component or the second electronic component.

12. The electronic device package of claim 10, wherein the first electronic component and the second electronic component form a group of electronic components and the conformal insulating layer conforms to the group of electronic components.

13. The electronic device package of claim 10, wherein a plurality of conductive layer portions is disposed between the first and second electronic components.

14. The electronic device package of claim 13, wherein the electrically conductive layer is formed about the first and second electronic components individually.

15. The electronic device package of claim 10, further comprising an encapsulation layer on the electrically conductive layer.

16. The electronic device package of claim 15, wherein at least a portion of the encapsulation layer is disposed between the first electronic component and the second electronic component.

17. The electronic device package of claim 15, wherein a portion of the encapsulation layer is in contact with the substrate.

18. The electronic device package of claim 17, wherein the encapsulation layer comprises an epoxy.

19. The electronic device package of claim 10, wherein a side portion of the electrically conductive layer is integrally formed with a top portion of the electrically conductive layer.

20. The electronic device package of claim 10, wherein a side portion of the electrically conductive layer is oriented at a non-perpendicular angle relative to a top surface of the substrate.

* * * * *